(12) United States Patent
Huang et al.

(10) Patent No.: US 10,964,626 B2
(45) Date of Patent: Mar. 30, 2021

(54) SEMICONDUCTOR STRUCTURE AND METHOD OF MAKING THE SAME

(71) Applicant: Taiwan Semiconductor Manufacturing Company, Ltd., Hsin-Chu (TW)

(72) Inventors: Yu-Ting Huang, Hsinchu (TW); Hsiang-Wei Lin, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/045,039

(22) Filed: Jul. 25, 2018

(65) Prior Publication Data

US 2018/0350723 A1 Dec. 6, 2018

Related U.S. Application Data

(62) Division of application No. 14/261,367, filed on Apr. 24, 2014, now Pat. No. 10,685,908.

(51) Int. Cl.
| | |
|---|---|
| H01L 23/485 | (2006.01) |
| H01L 21/74 | (2006.01) |
| H01L 21/768 | (2006.01) |
| H01L 23/522 | (2006.01) |
| H01L 23/528 | (2006.01) |
| H01L 23/532 | (2006.01) |

(52) U.S. Cl.
CPC .......... *H01L 23/485* (2013.01); *H01L 21/743* (2013.01); *H01L 21/76802* (2013.01); *H01L 21/76814* (2013.01); *H01L 21/76831* (2013.01); *H01L 21/76832* (2013.01); *H01L 21/76834* (2013.01); *H01L 21/76843* (2013.01); *H01L 21/76885* (2013.01); *H01L 23/528* (2013.01); *H01L 23/5226* (2013.01); *H01L 23/5329* (2013.01); *H01L 2924/0002* (2013.01)

(58) Field of Classification Search
CPC ................. H01L 23/485; H01L 23/528; H01L 21/76885; H01L 21/76843; H01L 21/76831; H01L 23/5226; H01L 21/743
See application file for complete search history.

(56) References Cited

U.S. PATENT DOCUMENTS

| | | |
|---|---|---|
| 6,303,486 B1 | 10/2001 | Park |
| 6,403,484 B1 | 6/2002 | Lim et al. |
| 6,475,929 B1 | 11/2002 | Gabriel et al. |

(Continued)

FOREIGN PATENT DOCUMENTS

| | | |
|---|---|---|
| CN | 1428839 A | 7/2003 |
| WO | 2004049432 | 6/2004 |

OTHER PUBLICATIONS

Chinese Office Action issued in CN201410344941.7 dated Feb. 7, 2018, 6 pages.

*Primary Examiner* — Julia Slutsker
(74) *Attorney, Agent, or Firm* — Haynes and Boone, LLP

(57) ABSTRACT

The present disclosure provides a method for forming a semiconductor structure. In accordance with some embodiments, the method includes providing a substrate and a conductive feature formed over the substrate; forming a low-k dielectric layer over the conductive feature; forming a contact trench aligned with the conductive feature; and selectively growing a sealing layer which is a monolayer formed on sidewalls of the contact trench.

20 Claims, 6 Drawing Sheets

(56) References Cited

U.S. PATENT DOCUMENTS

| | | | |
|---|---|---|---|
| 8,030,779 B2* | 10/2011 | Park | H01L 21/76808 |
| | | | 257/576 |
| 8,551,877 B2* | 10/2013 | Ranjan | H01L 21/02063 |
| | | | 438/622 |
| 9,613,852 B2 | 4/2017 | Lin et al. | |
| 2002/0155695 A1* | 10/2002 | Lee | H01L 21/76801 |
| | | | 438/622 |
| 2003/0008511 A1 | 1/2003 | Tsai et al. | |
| 2005/0208760 A1* | 9/2005 | Ryan | H01L 21/76807 |
| | | | 438/639 |
| 2007/0048954 A1 | 3/2007 | Kato et al. | |
| 2007/0202676 A1 | 8/2007 | Yeh et al. | |
| 2008/0182406 A1* | 7/2008 | Preusse | H01L 21/76844 |
| | | | 438/627 |
| 2008/0206986 A1 | 8/2008 | Preusse et al. | |
| 2009/0075472 A1* | 3/2009 | Arnold | H01L 21/02063 |
| | | | 438/623 |
| 2010/0041234 A1 | 2/2010 | Weigel et al. | |
| 2010/0078821 A1 | 4/2010 | Kahlert et al. | |
| 2010/0176472 A1 | 7/2010 | Shoji | |
| 2011/0003471 A1 | 1/2011 | King et al. | |
| 2012/0263876 A1 | 10/2012 | Haukka et al. | |
| 2014/0203447 A1* | 7/2014 | Bao | H01L 21/76802 |
| | | | 257/774 |
| 2014/0273496 A1 | 9/2014 | Kao et al. | |
| 2015/0108618 A1 | 4/2015 | Litsyn et al. | |
| 2015/0270156 A1 | 9/2015 | Lin et al. | |
| 2015/0311114 A1 | 10/2015 | Huang et al. | |

\* cited by examiner

SEMICONDUCTOR STRUCTURE AND METHOD OF MAKING THE SAME

PRIORITY DATA AND CROSS-REFERENCE TO RELATED APPLICATION

The present application is a divisional application of U.S. application Ser. No. 14/261,367 filed on Apr. 24, 2014, which is hereby incorporated by reference in its entirety. The present disclosure is related to the following commonly-assigned patent application, the entire disclosure of which is incorporated herein by reference: U.S. patent application Ser. No. 14/222,295 filed on Mar. 21, 2014, entitled "Semiconductor Structure and Method Making the Same".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with conductive features, etch stop layers, sealing layers, and/or barrier layers. There has been a desire to reduce resistance and improve device performance as feature sizes continue to decrease. Accordingly, it is desirable to have improved method and structure for the sealing layer in a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
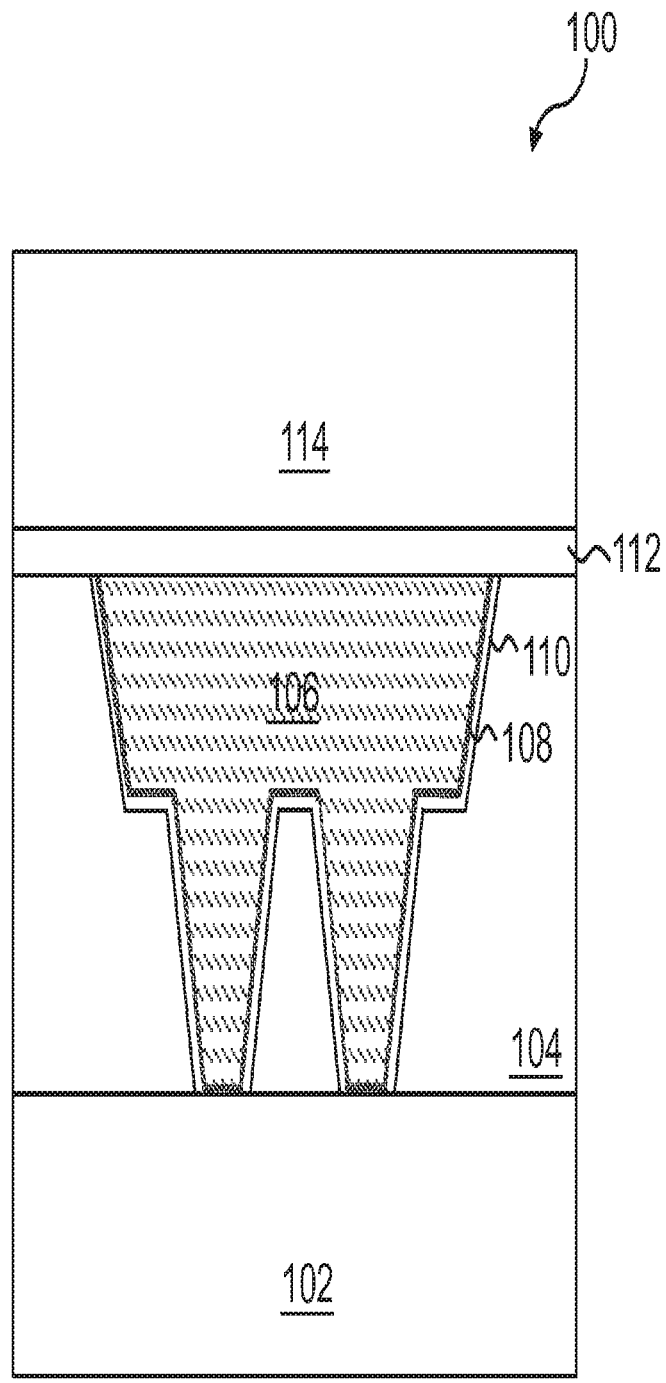
FIGS. 1-4 are diagrammatic sectional side views illustrating a semiconductor structure including a sealing layer at various fabrication steps, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-4 are diagrammatic sectional side views illustrating a semiconductor structure 100 including a sealing layer at various fabrication steps according to some embodiments of the present disclosure. It should be noted that the semiconductor structure 100 may be formed as part of a semiconductor device. The semiconductor structure 100 may also be fabricated with a CMOS process flow.

Referring to FIG. 1, a semiconductor structure 100 is provided. In some embodiments, the semiconductor structure 100 includes a substrate 102, a first low-k dielectric layer 104 disposed on the substrate 102, an etch stop layer (ESL) 112 formed on the first low-k dielectric layer 104, and a second low-k dielectric layer 114 formed on the ESL 114. In some embodiments as shown in FIG. 1, a conductive feature 106 is formed in the first low-k dielectric layer 104. In some embodiments, one or more layers, e.g., a sealing layer 108, and/or a barrier layer 110, may be formed along the sidewalls of the conductive feature 106. In some embodiments, a gate structure (not shown), e.g., metal gate (MG) or polygate structure may also be formed in the first low-k dielectric layer 104.

In some embodiments, the substrate 102 may be a silicon wafer. The substrate 102 may also include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the substrate 102 includes a semiconductor on insulator (SOI). In some embodiments, a dielectric layer may be formed over the substrate 102. In some embodiments, the dielectric layer may include silicon oxide. In some embodiments, the dielectric layer may additionally or alternatively include silicon nitride, silicon oxynitride, or other suitable dielectric material.

The substrate 102 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 102 may further include other functional features such as a resistor or a capacitor formed in and on the substrate. In some embodiments, the substrate 102 may further include lateral isolation features provided to separate various devices formed in the substrate 102. The isolation features may include shallow trench isolation (STI) features to define and electrically isolate the functional features. In some examples, the isolation regions may include silicon oxide, silicon nitride, silicon oxynitride, other suitable materials, or combinations thereof. The isolation regions may be formed by any suitable process. The substrate 102 may further include other features, such as silicide disposed on S/D and gate stacks overlying channels.

Referring to FIG. 1, the first low-k dielectric layer 104 may be an interlayer dielectric (ILD) layer. In some embodiments, the first low-k dielectric layer 104 may include silicon oxide, fluoride-doped silicate glass (FSG), a low-k dielectric material, and/or other suitable insulating material. In some embodiments, the first low-k dielectric layer 104 may include a single layer or multiple layers. In some embodiments, the first low-k dielectric layer 104 may be formed using a suitable technique, such as chemical vapor deposition (CVD), atomic layer deposition (ALD), and spin-on technique.

Still referring to FIG. 1, the conductive feature 106 may include a metal contact, a metal via, or a metal line. In some alternative embodiments, the conductive feature 106 includes an electrode of a capacitor, a resistor or a portion of a resistor. In some embodiments, the conductive feature 106 may include copper (Cu), aluminum (Al), tungsten (W), any suitable material, or combinations thereof. In some embodiments as shown in FIG. 1, the one or more layers formed along the sidewalls of the conductive feature 106, e.g., the sealing layer 108 and/or the barrier layer 110, are formed to prevent diffusion and/or provide material adhesion. In some embodiments, the sealing layer 108 may include an oxide layer or a nitride layer. In some embodiments, the barrier layer 110 may include one or more materials selected from the group consisting of aluminum (Al), copper (Cu), titanium (Ti), tungsten (W), titanium nitride (TiN), tantalum nitride (TaN), tungsten nitride (WN), titanium silicon nitride (TiSiN), tantalum silicon nitride (TaSiN), and combinations thereof. The barrier layer 110 may also include one or more metallic materials that are electrically conductive but do not permit inter-diffusion and reactions between the first low-k dielectric layer 104 and the conductive feature 106. The barrier layer 110 may include refractory metals and their nitrides.

In some embodiments, the conductive feature 106, the sealing layer 108, and the barrier layer 110 may be formed by a procedure including lithography, etching and deposition. For example, first low-k dielectric layer 104 may be patterned using a photolithograph process. One or more etching processes, e.g., drying etching process, wet etching process, or combinations thereof, may be performed to form contact trenches. The conductive feature 106, the sealing layer 108, and the barrier layer 110 may then be deposited by physical vapor deposition (PVD), chemical vapor deposition (CVD), metal-organic chemical vapor deposition (MOCVD), and atomic layer deposition (ALD), other suitable technique, or combinations thereof. A CMP process may be used to form a coplanar surface of the low-k dielectric layer 104 and the conductive feature 106.

Still referring to FIG. 1, an etch stop layer (ESL) 112 is formed on the coplanar surface of the low-dielectric layer 104 and the conductive feature 106. In some embodiments, the ESL 112 includes one or more metal element M, oxygen (O), hydrogen (H), carbon (C), and boron (B). In some embodiments, the one or more metal elements M are selected from the group consisting of aluminum (Al), titanium (Ti), tantalum (Ta), manganese (Mn), nickel (Ni), and ruthenium (Ru). In some examples, the ESL 112 includes one or more materials such as $M_xC_yN_z$. In some embodiments, the ESL 112 may include one or more elements selected from the group consisting of silicon (Si), oxygen (0), hydrogen (H), carbon (C), and nitrogen (N). In some examples, the ESL 112 includes one or more materials such as $Si_xO_yC_z$ or $M_xC_yN_z$. In some embodiments, the ESL 112 has a suitable etching selectivity over the low-k dielectric layer 114 in one or more subsequent etching processes to form contact trenches. In some embodiments, the ESL 112 may be deposited using any suitable technique, such as CVD, PVD, ALD, or an epitaxial growing process. In some embodiments, the thickness of the ESL 112 is in a range from about 10 Å to about 500 Å.

Although only one ESL 112 is illustrated in FIG. 1, semiconductor structure 100 may also include multiple ESLs to provide different etching selectivity. When multiple ESLs are formed in the semiconductor structure 100, more than one etching steps may be used to etch the multiple ESLs to form the contact trenches.

Still referring to FIG. 1, the second low-k dielectric layer 114 is formed on the ESL 112. In some embodiments, the second low-k dielectric layer 114 may be an interlayer dielectric (ILD) layer. In some embodiments, the second low-k dielectric layer 114 may include silicon oxide, fluoride-doped silicate glass (FSG), a low-k dielectric material, and/or other suitable insulating material. In some embodiments, the second low-k dielectric layer 114 may include a single layer or multiple layers. In some embodiments, the second low-k dielectric layer 114 may be formed using a suitable technique, such as CVD, ALD, and spin-on technique.

Figure 2:
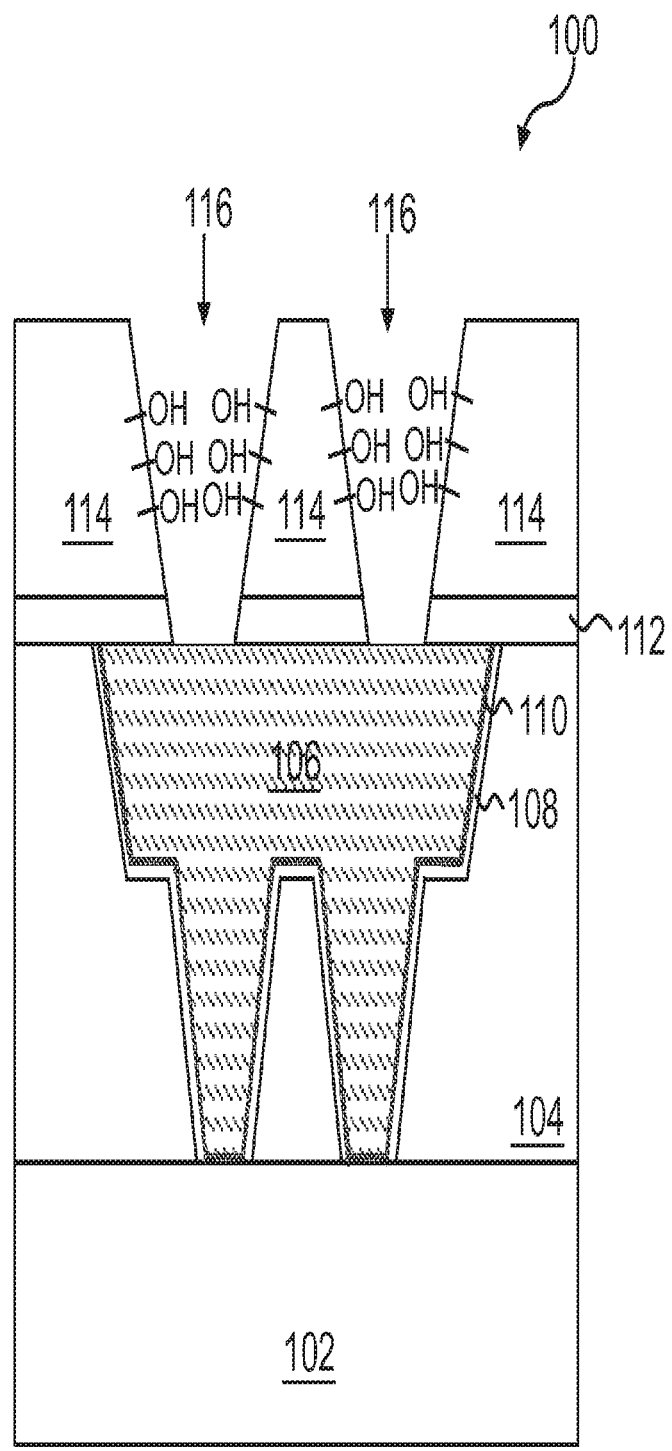

Referring to FIG. 2, the second low-k dielectric layer 114 is etched to form one or more contact trenches 116 aligned with the conductive feature 106 in the second low-k dielectric layer 114. In some embodiments, the contact trenches 116 may be formed by a lithography process and one or more etching processes. The lithography process is used to pattern the low-k dielectric layer 114. In some examples, the etching processes includes one or more dry etch processes to selectively remove the second low-k dielectric layer 114 and the ESL 112 in the contact regions to form the one or more contact trenches 116 using a suitable etchant, such as a $C_xH_yF_z$-based material. The $C_xH_yF_z$-based material may include difluoromethane ($CH_2F_2$). The low-k dielectric layer 114 and the ESL 112 may be removed using separate etching processes.

A wet clean step may then be performed to the contact trenches 116 to remove the remaining $C_xH_yF_z$-based material from the etching processes. A water ($H_2O$) based solution may be used for the wet clean step. The top surface of the conductive feature 106 may be exposed in the contact trenches 116 after the etching processes and the wet clean step.

As shown in FIG. 2, in some embodiments, because the low-k dielectric layer 114 includes one or more elements such as silicon (Si), O, C, and H, after etching to form the contact trenches 116, the sidewall surface of the contact trenches 116 may include —OH groups from the low-k dielectric layer 114. After the wet clean process performed to the contact trenches 116, the surface of the low-k dielectric materials may absorb water from the solution of the wet clean process, so that dangling bonds such as —OH groups may be formed on the sidewall surfaces of the contact trenches 116.

Figure 3:
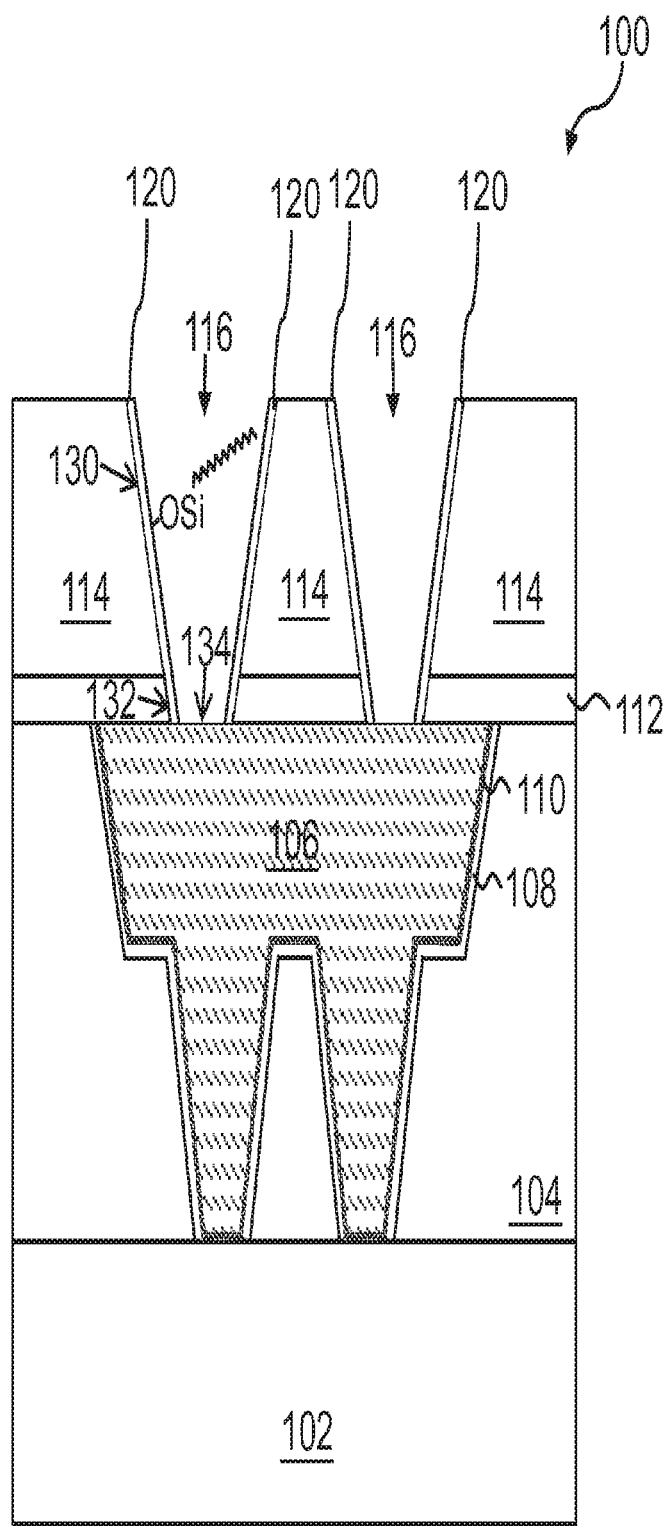

Referring to FIG. 3, a sealing layer 120 is formed using a deposition method, such as a thermal CVD process or an ALD process. In some embodiments, the sealing layer 120 is deposited using a chamber of a CVD tool, and the pressure of the chamber during the deposition is controlled to be in a range from about 10 Torr to about 60 Torr. In some embodiments, the deposition method may use one or more Si containing precursors, and the flow rate of the Si containing precursors is in a range from about 200 sccm to about 2000 sccm. In some embodiments, the deposition process may be conducted at a temperature in a range from about 200° C. to about 450° C. The sealing layer 120 may also be deposited using an ALD process to form a monolayer 120.

In some embodiments, the Si containing precursors may include hydrophilic groups configured to bond to the —OH groups on the sidewalls of the contact trenches 116 directly via chemisorption. The Si containing precursors may also include hydrophobic groups, such as alkyl chains. In some embodiments, the sealing layer 120 is formed as a self-assembled monolayer on the sidewall surfaces of low-k dielectric layer 114 exposed in the contact trenches 116. As shown in FIG. 3, the sealing layer 120 may include a hydrophilic side formed by the reaction between the —OH groups and the hydrophilic groups of the Si containing precursors. The hydrophilic side may be formed in direct contact with the low-k dielectric layer 114. The sealing layer 120 may also include a hydrophobic side including hydrophobic chains facing against the sidewall surface of the contact trench. Because the van der Walls interactions between the hydrophobic chains can repel each other, the sealing layer 120 can be formed well-ordered on the sidewall surfaces of the low-k dielectric layer 114.

In some examples, the Si containing precursors include one or more high order silane: R—Si—Cl$_3$, where R represents an alkyl chain including carbon (C) and hydrogen (H). In some examples, the alkyl chain can be C$_n$H$_{2n+1}$, C$_n$H$_{2n-1}$, or C$_n$H$_{4n-1}$. In some examples, the Si containing precursors include octadecyltrichlorosilane (ODTS): CH$_3$(CH$_2$)$_{17}$SiCl$_3$. In some embodiments, the formation of the sealing layer 120 can be illustrated using equation 1:

R—SiCl$_3$+Si—OH→Si—O—SiR+HCl  (1)

In some embodiments, the sealing layer 120 includes Si—O—SiR, where R is an alkyl chain. In some embodiments, the formation of the sealing layer using ODTS can be illustrated using equation 2:

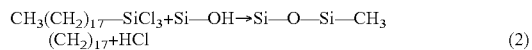

CH$_3$(CH$_2$)$_{17}$—SiCl$_3$+Si—OH→Si—O—Si—CH$_3$(CH$_2$)$_{17}$+HCl  (2)

The by-product HCl can be easily released in gaseous format during the reaction. In some embodiments, the sealing layer 120 includes one or more elements such as Si, O, and C. In some examples, the content percentage of Si is in a range from about 10% to about 20%. The content percentage of O is in a range from about 20% to about 40%. The content percentage of C is in a range from about 40% to about 70%. In some embodiments, the sealing layer 120 has a thickness in a range from about 5 Å to about 50 Å.

Still referring to FIG. 3, in some embodiments, because the —OH groups are formed on the surface of the etched portions of the low-k dielectric layer 114 (e.g., surface 130), the sealing layer 120 is a self-aligned layer that is formed in direct contact with the surfaces of the low-k dielectric layer 114 exposed in the contact trenches 116 (e.g., surface 130 of FIG. 3). The self-aligned sealing layer 120 is conformed to the sidewalls of the contact trenches 116. In some embodiments, because there may be —OH groups on the sidewalls of ESL layer 112 resulted from the wet clean process, the sealing layer 120 may also be formed in direct contact and conformed to the sidewalls of the etched portions of the ESL layer 112 (e.g., surface 132). In some embodiments, the sealing layer 120 is not formed on the bottom of the contact trenches 116 (e.g., surface 134) due to the lack of the —OH groups at the bottom of the contact trenches. The absence of the sealing layer on the bottom of the contact trenches and between the interlayer conductive features can effectively reduce the contact resistance thus improve the device performance.

Figure 4:
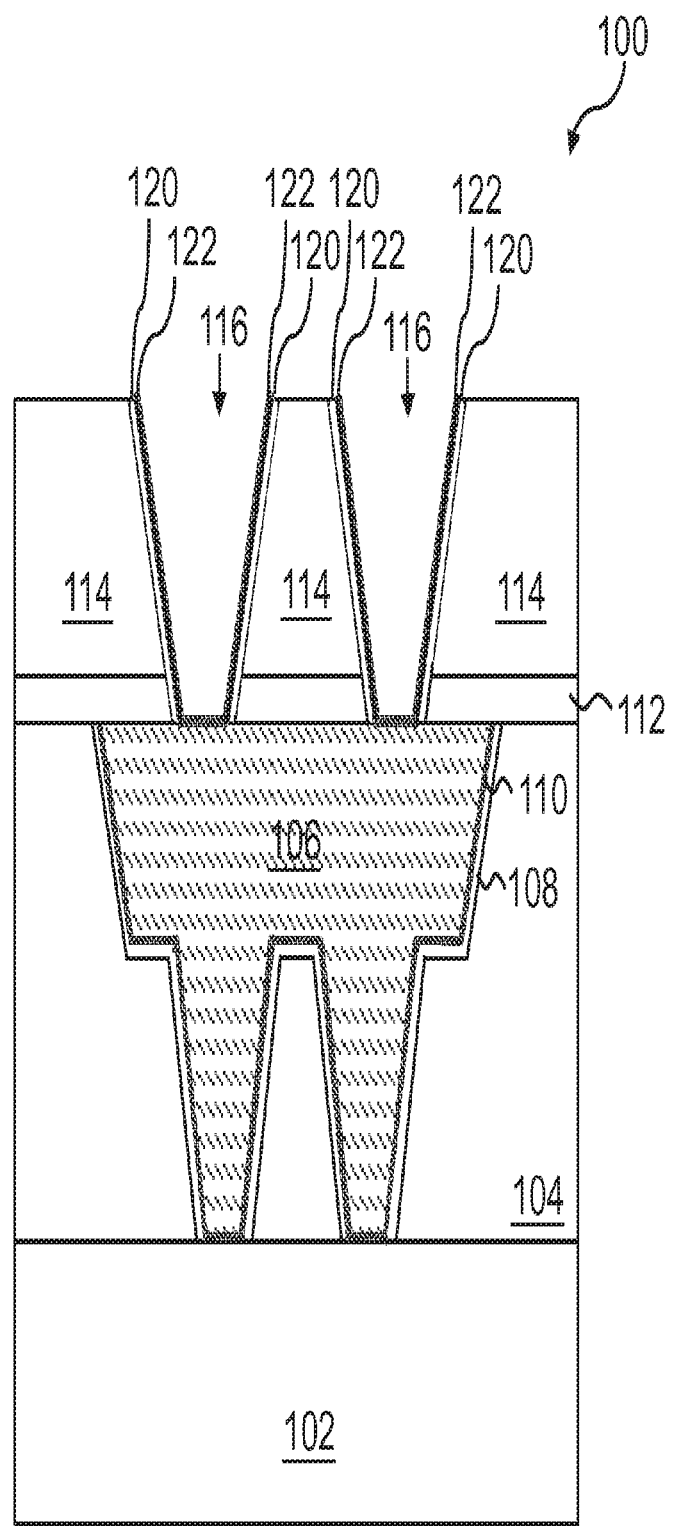

Referring to FIG. 4, a barrier layer 122 is formed on the sealing layer 120 to further prevent metal diffusion and/or provide material adhesion. In some embodiments, the barrier layer 122 is also formed on the exposed portions of the ESL 112 (e.g., surface 132 of FIG. 3) and the exposed top surface of the conductive feature 106 (e.g., top surface 134 of FIG. 3). In some embodiments, the barrier layer 122 may include one or more metallic materials that are electrically conductive but do not permit inter-diffusion and reactions between the second low-k dielectric layer 114 and the conductive feature to be deposited in the contact trenches 116. In some embodiments, the barrier layer 122 includes one or more materials selected from the group consisting of aluminum (Al), copper (Cu), titanium (Ti), tungsten (W), titanium nitride (TiN), tantalum nitride (TaN), tungsten nitride (WN), titanium silicon nitride (TiSiN), tantalum silicon nitride (TaSiN), and combinations thereof. In some embodiments, the barrier layer 122 may be formed using a PVD method. In some embodiments of the present disclosure, the barrier layer 122 is optional, as the sealing layer 120 may provide sufficient prevention of the material diffusion between the conductive feature to be filled in contact trenches 116 and the low-k dielectric layer 114.

Figure 5:
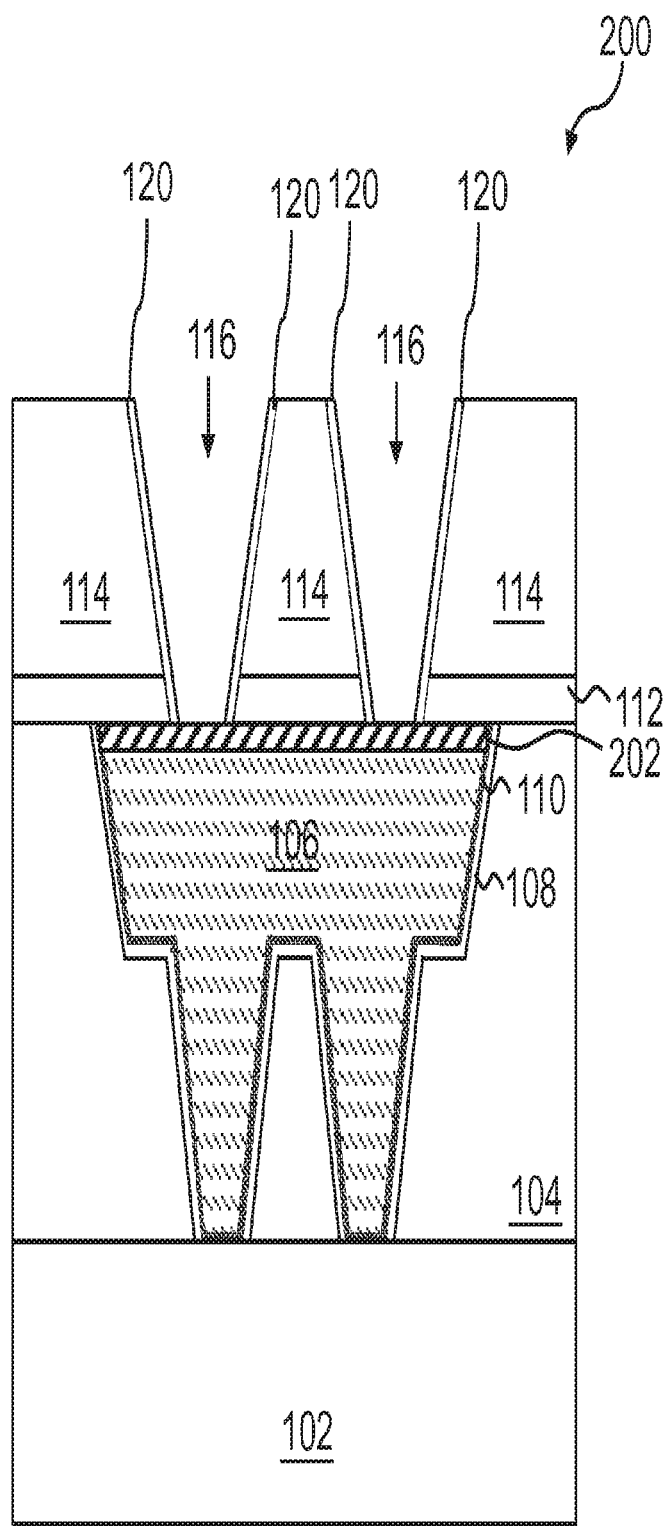
FIG. 5 is a diagrammatic sectional side view illustrating a semiconductor structure including a sealing layer and a cap layer, in accordance with some embodiments.

FIG. 5 is a diagrammatic sectional side view illustrating a semiconductor structure 200 including a sealing layer 120 and a cap layer 202, in accordance with some embodiments. The other material layers and the fabrication processes of the semiconductor structure 200 are substantially similar to those of the semiconductor structure 100. It is to be understood that the semiconductor 200 is an alternative embodiment of the semiconductor 100, as the cap layer 202 is optional in the present disclosure.

In some embodiments, the cap layer 202 includes a cobalt (Co) cap layer. In some alternative embodiments, the cap layer 202 includes at least one layer of manganese (Mn), nickel (Ni), ruthenium (Ru), titanium (Ti) and/or combinations thereof. In some embodiments, the cap layer 202 may be deposited using any suitable technique, such as CVD or ALD. In some embodiments, the thickness of the cap layer 202 is in a range from about 10 Å to about 100 Å. In some embodiments as shown in FIG. 5, the cap layer 202 is selectively grown on the conductive feature 106 for capping the conductive feature 106. Therefore, the cap layer 202 is self-aligned with the conductive feature 106. The cap layer 202 may effectively reduce the contact resistance and avoid the electromigration between different layers of interconnect structures. The cap layer 202 may also provide a good intrinsic adhesion between the conductive feature 106 and the subsequent layers formed on the conductive feature, such as ESL 112, so that the material integration of the semiconductor structure can be improved. In some embodiments, the one or more etching processes performed to the low-k dielectric layer 114 and the ESL 112 may stop at the surface of the cap layer 202, so that the top surface of the cap layer 202 may not be damaged during the one or more etching processes. In some embodiments, the formation, material compositions, and the thickness of the sealing layer 120 and the other material layers in semiconductor structure 200 are substantially similar to those of the semiconductor structure 100 as described with regard to FIGS. 3-4.

Figure 6:
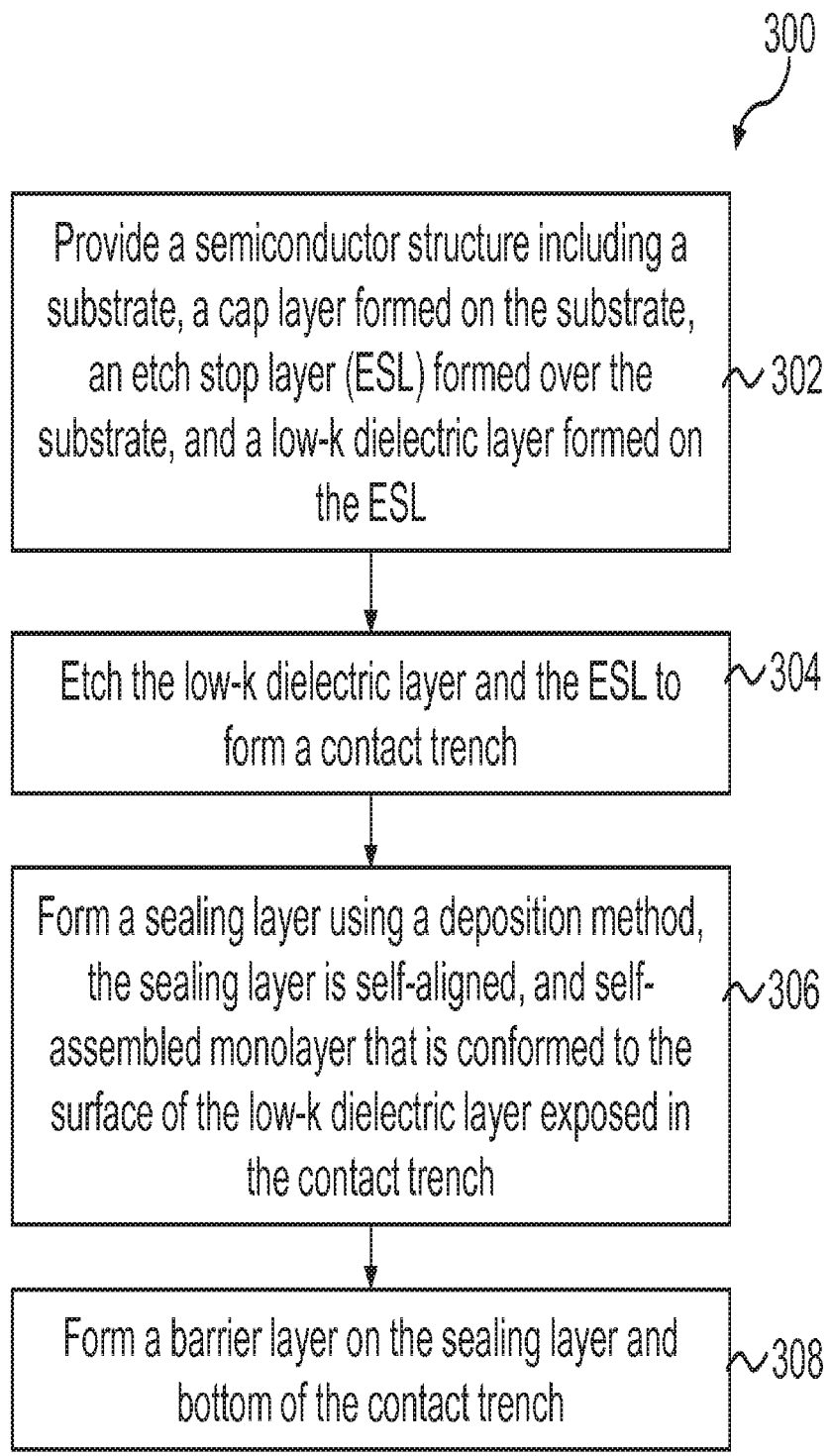
FIG. 6 is a flow chart showing an illustrative method for forming a semiconductor structure including a sealing layer, in accordance with some embodiments.

FIG. 6 is a flow chart showing an illustrative method 300 for forming the semiconductor structures 100, and/or 200, including the sealing layer 120 according to some embodiments of the present disclosure. Method 300 includes a process 302 for providing a semiconductor structure, a process 304 for etching the low-k dielectric layer and the ESL to form a contact trench, a process 306 for form a self-aligned sealing layer, and an optional process 408 for forming a barrier layer. It should be understood that additional processes may be provided before, during, and after the method 400 of FIG. 10, and that some other processes may be briefly described herein.

At process 302, a semiconductor structure (semiconductor structure 100, or 200 of the present disclosure) is provided. In some embodiments, the semiconductor structure includes a substrate 102, a conductive feature 106 formed over the substrate, an ESL 112 formed on the conductive feature 106, a low-k dielectric layer 114 formed on the conductive feature 106. In some embodiments, the semiconductor structure may include multiple ESLs. In some embodiments, the semiconductor structure may include a cap layer formed self-aligned with the conductive feature 106. e.g., the cap layer 202 of the semiconductor structure 200.

At process 304, the low-k dielectric layer 114 and the ESL 112 are etched to form one or more contact trenches 116. In some embodiments, when there is only one layer of ESL 112, the etching process may include a dry etch process to remove the low-k dielectric layer 114 and the ESL 112 in the contact regions. In some embodiments, when there are multiple ESLs, the etching process may include more than one etch step to remove multiple ESLs. The dry etch may be selectively performed to the low-k dielectric layer 114 and the ESL 112 without etching the conductive feature 106. In some embodiments when there is a cap layer 202, the etch process can be controlled to stop at the top surface of the cap layer 202.

At process 306, a deposition process is performed to form a sealing layer 120 on the surface of the low-dielectric layer 114 exposed in the contact trenches 116. In some embodiments, the sealing layer 120 is a self-aligned layer in direct contact and conformed to the sidewall surface of the low-k dielectric layer 114 (e.g., surface 130 of FIG. 3). In some embodiments, the sealing layer 120 is also in direct contact and conformed to the sidewall surface of the etched ESL 112 (e.g., surface 132 of FIG. 3). In some embodiments, the sealing layer 120 is formed by a chemisorption reaction between the Si containing precursor (e.g., ODTS) and the —OH groups on the sidewall surface of the low-d dielectric layer 114 and/or the ESL 112. Therefore, the sealing layer 120 is a well-ordered and self-assembled monolayer.

At an optional process 308, a barrier layer 122 is further formed on the sealing layer 120 and the top surface of the conductive feature 106 as shown in FIG. 4 to further prevent metal diffusion and/or provide material adhesion. The barrier layer 122 is optional in the present disclosure, as the sealing layer 120 may provide sufficient prevention of the material diffusion between the conductive feature to be filled in contact trenches 116 and the low-k dielectric layer 114.

Although not shown, it is to be understood that one or more subsequent processes are performed for the fabrication of the semiconductor device. In some examples, the method further includes depositing a metal layer on the barrier layer to fill the contact trenches; and performing a chemical mechanical polishing (CMP) process to form a contact metal in the trench. The contact metal and the dielectric layer are coplanar after the CMP process.

The present embodiments describe mechanisms for forming a sealing layer in a semiconductor device. The mechanisms involve forming contact trenches, and forming the sealing layer on sidewalls of the contact trenches. In some embodiments, the sealing layer is not formed on the bottom of the contact trenches. The sealing layer can be formed using a deposition method, such as a CVD method or an ALD method. The mechanisms provide a sealing layer that is self-aligned and conformed to sidewalls of the contact trenches. The mechanisms also provide a sealing layer that is a self-assembled and well-ordered monolayer formed on the sidewalls of the contact trenches.

The present disclosure provides a method for forming a semiconductor structure. In accordance with some embodiments, the method includes providing a substrate and a conductive feature formed over the substrate; forming a low-k dielectric layer over the conductive feature; forming a contact trench aligned with the conductive feature; and selectively growing a sealing layer which is a monolayer formed on sidewalls of the contact trench.

The present disclosure provides a method for forming a semiconductor structure. In accordance with some embodiments, the method includes providing a substrate and a conductive feature formed over the substrate; forming an etch stop layer over the conductive feature; forming a low-k dielectric layer over the etch stop layer; etching the low-k dielectric layer to form a contact trench aligned with the conductive feature in the low-k dielectric layer; etching the etch stop layer using the contact trench in the low-k dielectric layer as an etching mask to extend the contact trench through the etch stop layer; and forming a Si containing sealing layer using a Si containing precursor. In some embodiments, the sealing layer is self-aligned and conformed to sidewall surfaces of the contact trench.

The present disclosure provides a semiconductor structure. In accordance with some embodiments, the structure includes a semiconductor substrate and a conductive feature formed over the substrate; an etch stop layer formed over the conductive feature; a low-k dielectric layer formed over the etch stop layer; a contact trench formed through the low-k dielectric layer and the etch stop layer; and a self-assembled sealing layer formed on sidewalls of the contact trench. In some embodiments, the self-assembled sealing layer is a monolayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate and a conductive feature formed over the semiconductor substrate;
an etch stop layer formed over the conductive feature;
a cap layer formed between and physically contacting the conductive feature and the etch stop layer;
a low-k dielectric layer formed over the etch stop layer;
a first contact trench formed through the low-k dielectric layer and the etch stop layer;
a second contact trench formed through the low-k dielectric layer and the etch stop layer;
a first portion and a second portion of a sealing layer, which is a monolayer, the first portion and the second portion formed on opposite sidewalls of the first contact trench, wherein the sealing layer is not disposed directly on the conductive feature between the first portion and the second portion, wherein the first portion and the second portion of the sealing layer are not disposed over a first portion of the cap layer; and
a third portion and a fourth portion of the sealing layer formed on opposite sidewalls of the second contact trench, wherein the sealing layer is not disposed directly on the conductive feature between the third portion and the fourth portion, wherein the third portion and the fourth portion of the sealing layer are not disposed over a second portion of the cap layer, wherein a third portion of the cap layer extends between the first portion and the second portion of the cap layer and extends under the second portion and the third portion of the sealing layer and the etch stop layer.

2. The semiconductor structure of claim 1, wherein the sealing layer is self-assembled and includes:
a hydrophilic side being self-aligned and in direct contact with the low-k dielectric layer, and
a hydrophobic side facing against the sidewalls of the first contact trench.

3. The semiconductor structure of claim 1, wherein the sealing layer is a self-assembled Si containing sealing layer with a thickness in a range from about 5 Å to about 50 Å.

4. The semiconductor structure of claim 3, wherein the self-assembled Si containing sealing layer has a composition of Si in a range from about 10% to about 20%, O in a range from about 20% to about 40%, and C in a range from about 40% to about 70%.

5. The semiconductor structure of claim 1,
wherein the cap layer is self-aligned with a top surface of the conductive feature, and
wherein the first contact trench exposing a top surface of the cap layer.

6. The semiconductor structure of claim 1, further comprising:
a barrier layer formed over the sealing layer,
wherein the barrier layer is conformed to the sealing layer and a bottom of the first contact trench.

7. A semiconductor device, comprising:
a semiconductor substrate;
a first low-k dielectric layer formed over the semiconductor substrate;
a conductive feature formed within the first low-k dielectric layer;
an etch stop layer formed over the conductive feature;
a cap layer formed between the conductive feature and the etch stop layer;
a second low-k dielectric layer formed over the etch stop layer;
a first contact trench formed through the second low-k dielectric layer and the etch stop layer, such that the etch stop layer extends over a portion of the conductive feature, wherein a first portion of the cap layer defines a bottom surface of the first contact trench;
a second contact trench formed through the second low-k dielectric layer and the etch stop layer, wherein a second portion of the cap layer defines a bottom surface of the second contact trench; and
a sealing layer formed on sidewalls of the first and second contact trenches, wherein the sealing layer is not disposed directly over the first portion of the cap layer, wherein a third portion of the cap layer extends between the first portion and the second portion of the cap layer, the third portion of the cap layer extending under the sealing layer.

8. The semiconductor device of claim 7, wherein the conductive feature extends from a top surface of the first low-k dielectric layer to a top surface of the semiconductor substrate.

9. The semiconductor device of claim 7, wherein the sealing layer is self-assembled and includes:
a hydrophilic side being self-aligned and in direct contact with the low-k dielectric layer, and
a hydrophobic side facing against the sidewalls of the first and second contact trenches.

10. The semiconductor device of claim 7, wherein the sealing layer is a self-assembled Si containing sealing layer with a thickness in a range from about 5 Å to about 50 Å.

11. The semiconductor device of claim 10, wherein the self-assembled Si containing sealing layer has a composition of Si in a range from about 10% to about 20%, O in a range from about 20% to about 40%, and C in a range from about 40% to about 70%.

12. A semiconductor device, comprising:
a semiconductor substrate;
a conductive feature formed over the semiconductor substrate and within a first low-k dielectric layer, such that the conductive feature is disposed between a first portion and a second portion of the first low-k dielectric layer;
an etch stop layer formed over the conductive feature and the first low-k dielectric layer;
a cap layer formed between the conductive feature and the etch stop layer;
a second low-k dielectric layer formed over the etch stop layer;
a first contact trench formed through the second low-k dielectric layer and the etch stop layer, such that the etch stop layer extends over a first portion of the conductive feature, wherein a first portion of the cap layer defines a bottom surface of the first contact trench; and
a second contact trench formed through the second low-k dielectric layer and the etch stop layer, such that the etch stop does not extend over a second portion of the conductive feature aligned with the first contact trench and a third portion of the conductive feature aligned with the second contact trench, wherein a second portion of the cap layer defines a bottom surface of the second contact trench, wherein a third portion of the cap layer extends between the first portion and the second portion of the cap layer, the third portion of the cap layer extending under and physically contacting the etch stop layer.

13. The semiconductor device of claim 12, wherein a third portion of the low-k dielectric layer extends between the conductive feature and the semiconductor substrate.

14. The semiconductor device of claim 12, further comprising a sealing layer disposed on sidewalls of the first and second contact trenches.

15. The semiconductor device of claim 12, wherein the second contact trench exposes the second portion of the cap layer.

16. The semiconductor device of claim 14, wherein the sealing layer is self-assembled and includes:
 a hydrophilic side being self-aligned and in direct contact with the low-k dielectric layer, and
 a hydrophobic side facing against the sidewalls of the first contact trench.

17. The semiconductor device of claim 14, wherein the sealing layer is a self-assembled Si containing sealing layer with a thickness in a range from about 5 Å to about 50 Å.

18. The semiconductor device of claim 17, wherein the self-assembled Si containing sealing layer has a composition of Si in a range from about 10% to about 20%, O in a range from about 20% to about 40%, and C in a range from about 40% to about 70%.

19. The semiconductor device of claim 7, wherein the etch stop layer extends over the portion of the conductive feature on opposing sides of the first contact trench.

20. The semiconductor device of claim 12, wherein the conductive feature extends from a top surface of the low-k dielectric layer to a bottom surface of the low-k dielectric layer.

* * * * *